(12) United States Patent
Ou

(10) Patent No.: US 11,223,031 B2
(45) Date of Patent: Jan. 11, 2022

(54) FULL COLOR DISPLAY MODULE AND MANUFACTURING METHOD OF SAME

(71) Applicant: WUHAN CHINA STAR OPTOELECTRONICS SEMICONDUCTOR DISPLAY TECHNOLOGY CO., LTD., Wuhan (CN)

(72) Inventor: Jianbing Ou, Wuhan (CN)

(*) Notice: Subject to any disclaimer, the term of this patent is extended or adjusted under 35 U.S.C. 154(b) by 22 days.

(21) Appl. No.: 16/648,246

(22) PCT Filed: Nov. 13, 2019

(86) PCT No.: PCT/CN2019/118204
§ 371 (c)(1),
(2) Date: Mar. 18, 2020

(87) PCT Pub. No.: WO2020/098722
PCT Pub. Date: May 22, 2020

(65) Prior Publication Data
US 2021/0167331 A1 Jun. 3, 2021

(30) Foreign Application Priority Data
Nov. 15, 2018 (CN) .......................... 201811361575.0

(51) Int. Cl.
*H01L 51/52* (2006.01)
*H01L 27/32* (2006.01)
(Continued)

(52) U.S. Cl.
CPC ...... *H01L 51/5265* (2013.01); *H01L 27/3211* (2013.01); *H01L 27/3216* (2013.01);
(Continued)

(58) Field of Classification Search
CPC ............. H01L 51/5265; H01L 27/3211; H01L 27/3216; H01L 27/3244; H01L 51/0011;
(Continued)

(56) References Cited

U.S. PATENT DOCUMENTS 8,957,442 B2 * 2/2015 Seo ..................... H01L 51/5265
257/98
9,508,946 B2 * 11/2016 Song ................... H01L 51/5008
(Continued)

FOREIGN PATENT DOCUMENTS

CN 101207184 A 6/2008
CN 102024844 A 4/2011
(Continued)

*Primary Examiner* — Kyoung Lee
*Assistant Examiner* — Christina A Sylvia

(57) ABSTRACT

The present disclosure provides a full-color display module with microcavity effect. The full-color display module includes a glass substrate, a thin film transistor layer, an anode layer, a cathode layer, a white light emitting layer and a resonant cavity structure. The resonant cavity structure includes a first transparent organic layer, a first semi-reflective metal layer, a second transparent organic layer and a second semi-reflective metal layer, which are sequentially formed on the cathode layer, and the lights at specific wavelengths are strengthened by adjusting thicknesses of the transparent organic layers.

20 Claims, 4 Drawing Sheets

(51) Int. Cl.
*H01L 51/00* (2006.01)
*H01L 51/56* (2006.01)

(52) U.S. Cl.
CPC ...... *H01L 27/3244* (2013.01); *H01L 51/0011* (2013.01); *H01L 51/5218* (2013.01); *H01L 51/5234* (2013.01); *H01L 51/56* (2013.01); *H01L 2227/323* (2013.01)

(58) Field of Classification Search
CPC . H01L 51/5218; H01L 51/5234; H01L 51/56; H01L 2227/323; H01L 27/3206; H01L 27/322
See application file for complete search history.

(56) References Cited

U.S. PATENT DOCUMENTS

| | | | |
|---|---|---|---|
| 10,622,577 B2* | 4/2020 | Choi | H01L 27/3211 |
| 10,937,983 B2* | 3/2021 | Ye | H01L 51/5221 |
| 2008/0241561 A1 | 10/2008 | Jeong et al. | |
| 2009/0096359 A1 | 4/2009 | Lee | |
| 2011/0062475 A1 | 3/2011 | Cho | |
| 2012/0299031 A1 | 11/2012 | Shiratori | |
| 2013/0146853 A1* | 6/2013 | Lee | H01L 51/0012 257/40 |
| 2017/0236881 A1 | 8/2017 | Shen et al. | |
| 2017/0317147 A1 | 11/2017 | Sun et al. | |
| 2019/0372060 A1* | 12/2019 | Li | H01L 51/56 |
| 2020/0144549 A1 | 5/2020 | Zhou et al. | |
| 2020/0251535 A1 | 8/2020 | Fan et al. | |

FOREIGN PATENT DOCUMENTS

| | | |
|---|---|---|
| CN | 103441136 A | 12/2013 |
| CN | 104409468 A | 3/2015 |
| CN | 107316880 A | 11/2017 |
| CN | 107958963 A | 4/2018 |
| CN | 108511628 A | 9/2018 |
| CN | 108695359 A | 10/2018 |
| KR | 20100036908 A | 4/2010 |

* cited by examiner

FULL COLOR DISPLAY MODULE AND MANUFACTURING METHOD OF SAME

BACKGROUND OF INVENTION

Field of Invention

The present disclosure relates to the field of full-color display technology, and more particularly to the field of full-color display module liquid crystal display technology with microcavity effect.

Description of Prior Art

Compared with conventional liquid crystal display screens, active matrix organic light emitting diode (hereinafter referred to as AMOLED) screens have advantages such as faster response speed, self-illumination, wide viewing angle, good display effect and low power consumption. Because of the above advantages, AMOLED screens have been widely adopted in smart phones.

As shown in FIG. 1, the current AMOLED full-color display structure uses a red, green and blue primary color juxtaposition method to fabricate a thin film transistor (Thin Film Transistor, hereinafter referred to as TFT) layer 20 on a glass substrate 10; anode layers 30 respectively corresponding to pixel structures of three colors of red, green, and blue are fabricated on the TFT layer 20; a red organic light emitting layer 40, a green organic light emitting layer 42, and a blue organic light emitting layer 44 are formed on the corresponding anode layers 30 respectively; a cathode layer 50 is formed on the red organic light emitting layer 40, the green organic light emitting layer 42, and the blue organic light emitting layer 44. The existing process for producing the pixel structure of three colors uses a vapor deposition method, that is, when a group of organic materials including red pixels, green pixels, and blue pixels are vapor-deposited, a metal mask are used through a high-precision alignment to covers the other two sub-pixels, and heat-evaporates the material to the specified position. According to this method, pixel structures of other colors are vapor-deposited separately.

However, when the current method is used for vapor deposition, the red pixel, green pixel, and blue pixel material vapor deposition positions are often shifted due to reasons such as insufficient manufacturing accuracy or insufficient alignment accuracy of the mask, and then problems such as color mixing errors, pixel defects occur. Therefore, a new full-color display technology is needed to solve the defects of the existing technology.

SUMMARY OF INVENTION

In order to resolve the above problem of the existing technologies, an object of the present disclosure is to provide a full-color display module with microcavity effect and a method for manufacturing the same, which emits three primary color lights of red, green and blue by making white light to pass through a microcavity structure and occur the microcavity resonance effect, then the lights at specific wavelengths are strengthened, the color purities of lights are improved by narrowing its electroluminescence spectrums.

In order to achieve above-mentioned objects, the present disclosure provides a full-color display module with microcavity effect, the full-color display module includes a glass substrate; a thin film transistor (TFT) layer fabricated on the glass substrate, an anode layer corresponding to each pixel unit fabricated on the TFT layer, and the anode layer electrically connected to the TFT layer to match the driving control of each pixel unit by the TFT layer; a white light emitting layer formed on the corresponding anode layer; a cathode layer formed on the white light emitting layer; a resonant cavity structure formed on the anode layer, the resonant cavity structure further includes a first transparent organic layer, a first semi-reflective metal layer, a second transparent organic layer and a second semi-reflective metal layer, which are sequentially formed on the cathode layer; wherein a plurality of electron hole transmission layers of the pixel units of the resonant cavity structure for different primary color lights have different thicknesses to achieve the desired color light emission effect, a thickness of the electron hole transmission layer of red light is about 60 nm, a thickness of the hole transmission layer of green light is about 50 nm, and a thickness of the hole transmission layer of blue light is about 30 nm.

In the embodiment of present disclosure, the anode layer is an omni-reflective metal layer, and the cathode layer is a semi-reflective metal layer.

In the embodiment of present disclosure, the white light emitting layer is a stacked structure combing different color light structures.

In the embodiment of present disclosure, the first semi-reflective metal layer and the second semi-reflective metal layer are made of same material as the cathode layer.

In the embodiment of present disclosure, the pixel units may be set in a manner that the pixel units corresponding to various colors have the same number and are evenly distributed, or alternatively, may be set in a manner that a number of pixel units of a specific color are set different from a number of the pixel units of other colors.

In the embodiment of present disclosure, a size or an opening width of the pixel units of the various colors are made in a manner that the pixel units of each color have the same size or the same opening width, or alternatively, the size or the opening width of the pixel units are made in a manner that the pixel unit corresponding to a specific color has different size or different opening width relative to the ones corresponding to other colors.

Another embodiment of the present disclosure provides a manufacturing method of a full-color display module with microcavity effect, the manufacturing method includes following steps of:

step S1: fabricating a thin film transistor (TFT) layer on a glass substrate;

step S2: fabricating an anode layer corresponding to each pixel unit on the TFT layer, wherein the anode layer corresponding to each pixel unit is electrically connected to the TFT layer to match a driving control of each pixel unit by the TFT layer;

step S3: forming a white light emitting layer on the corresponding anode layer, wherein the white light emitting layer is fabricated by using a common metal mask (CMM) as a mask in a vapor deposition process;

step S4: forming a cathode layer on the white light emitting layer; and step S5: forming a resonant cavity structure on the cathode layer, wherein the resonant cavity structure sequentially includes a first transparent organic layer, a first semi-reflective metal layer, a second transparent organic layer and a second semi-reflective metal layers on the cathode layer;

wherein a plurality of electron hole transmission layers of the pixel units of the resonant cavity structure for different primary color lights have different thicknesses to achieve the desired color light emission effect, a thickness of the electron hole transmission layer of red light is about 60 nm, a thickness of the hole transmission layer of green light is about 50 nm, and a thickness of the hole transmission layer of blue light is about 30 nm.

In another embodiment of the present disclosure, the step S5 further includes following steps of:

step S51: firstly using the CMM as a mask for the vapor deposition process to fabricate a transparent organic layer having a minimum required thickness for a corresponding color light; and step S52: using a fine metal mask (FMM) as a mask for the vapor deposition process to fabricate the transparent organic layers required for other color lights.

The present disclosure has the following advantages. The full-color display module with a microcavity effect and a manufacturing method thereof provided by the embodiments of the present disclosure, which emits three primary color lights of red, green and blue by making white light to pass through a microcavity structure and occur the microcavity resonance effect, then the lights at specific wavelengths are strengthened, the color purities of lights are improved by narrowing its electroluminescence spectrums. Therefore, the problems such as color mixing errors and pixel defects can be effectively avoided, and the present disclosure is conducive to the application of display technologies.

BRIEF DESCRIPTION OF DRAWINGS

In order to illustrate the technical solutions of the embodiments of the present disclosure or the existing technologies more clearly, the following drawings with reference to the exemplary embodiments of the present disclosure or the existing technologies are concisely described below. Obviously, the specific embodiments described herein are only some examples of the present disclosure. Based on the following drawings, a person skilled in the art may obtain further drawings without making inventive effort.

DETAILED DESCRIPTION OF INVENTION

The embodiment described in specific implementation means that a particular feature, structure, or characteristic described in connection with the embodiment may be included in at least one embodiment of the present disclosure. The use of the same terms in different places in the specification is not necessarily limited to the same implementation, but should be understood as being independent or alternative to each other. Under the inspiration of the technical solutions disclosed in the embodiments provided by the present disclosure, a person of ordinary skill in the art should understand that the embodiments described in the present disclosure may have other technical solution combinations or changes that conform to the concept of the present disclosure.

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", "vertical", "horizontal", etc. are only directions with regard to the accompanying drawings. Therefore, the directional terms used for describing and illustrating the present disclosure are not intended to limit the present disclosure.

Figure 1:
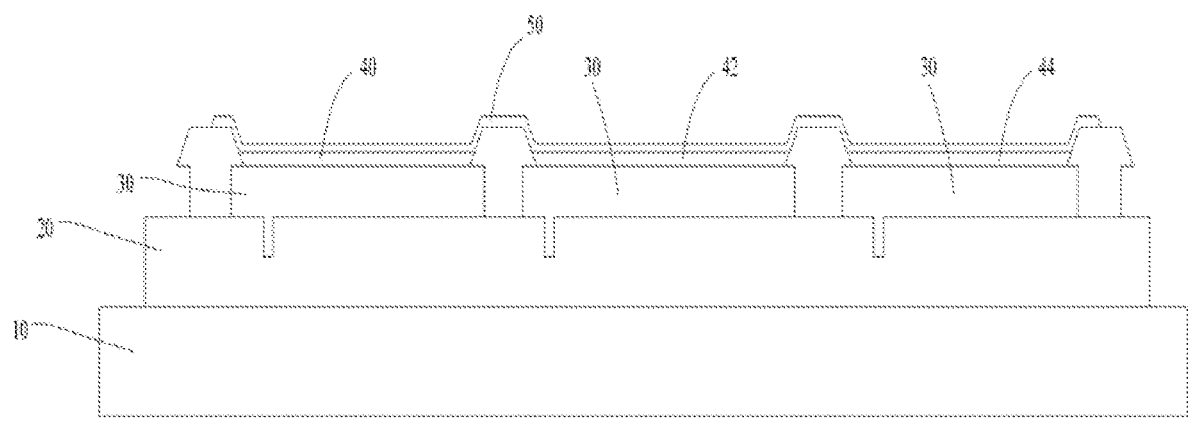
FIG. 1 is a schematic structural diagram of a conventional AMOLED display module.
Figure 2:
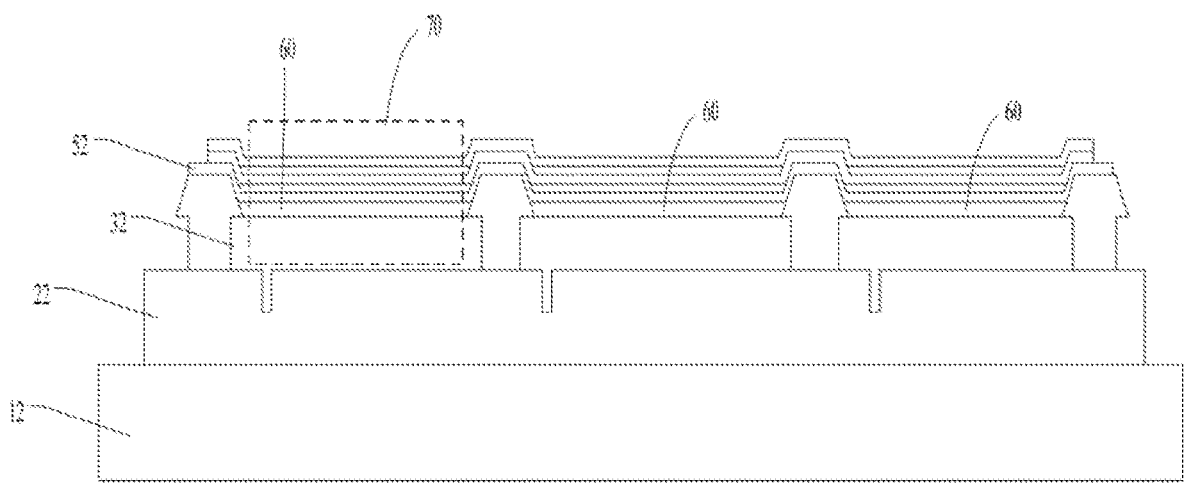
FIG. 2 is a schematic structural diagram of a full-color display module with a microcavity effect provided by an embodiment of the present disclosure.

FIG. 2 is a schematic structural diagram of a full-color display module using a microcavity effect provided by an embodiment of the present disclosure. As shown in FIG. 2, the full-color display module includes a glass substrate 12, a thin film transistor (hereinafter referred to as TFT) layer 22, an anode layer 32, a cathode layer 52, a white light emitting layer 60 and a resonant cavity structure 70.

The TFT layer 22 is fabricated on the glass substrate 12. The anode layer 32 corresponding to each pixel unit is fabricated on the TFT layer 22, and the anode layer 32 is electrically connected to the TFT layer 22 to match the driving control of each pixel unit by the TFT layer 22. The white light emitting layer 60 is formed on the corresponding anode layer 32, the cathode layer 52 is formed on the white light emitting layer 60, and the cathode layer 52 can cover the entire white light emitting layer 60. When the driving voltage applied by the TFT layer 22 to the anode layer 32 corresponding to each pixel unit reaches a minimum lighting voltage value that can light up the white light emitting layer 60, the voltage difference between the anode layer 32 and the cathode layer 52 can light up the white light emitting layer 60. The anode layer 32 is an omni-reflective metal layer, and is preferably made of an indium tin oxide (hereinafter referred to as ITO) layer or a silver (Ag) material. The cathode layer 52 is a semi-reflective metal layer, and is preferably made of magnesium (Mg) or silver material.

A common metal mask (hereinafter referred to as CMM) can be used as a mask for the vapor deposition process to produce the white light emitting layer 60. The white light emitting layer 60 can be a stacked structure, for example, a combination of yellow light and blue light, or a stacked structure combining red, green, and blue lights, to achieve the effect for emitting white light. The white light emitting layer 60 may be composed of organic light emitting diode (hereinafter referred to as OLED) components, or may be composed of other components capable of emitting white light, such as quantum dot components.

Figure 3:
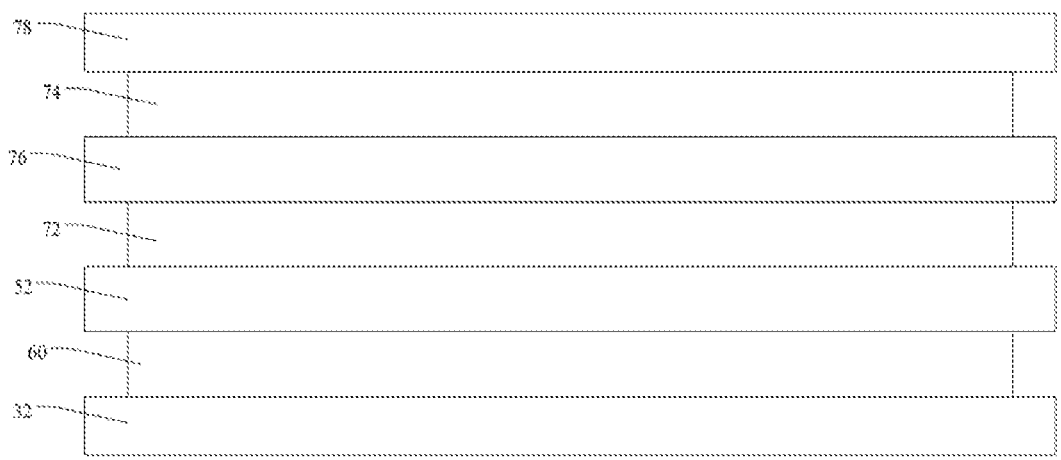
FIG. 3 is a detailed schematic structural view of the resonant cavity structure in FIG. 2.

FIG. 3 is a detailed structural diagram of the resonant cavity structure 70 shown in FIG. 2. As shown in FIG. 3, the resonant cavity structure 70 includes a first transparent organic layer 72, a first semi-reflective metal layer 76, a second transparent organic layer 74 and a second semi-reflective metal layer 78, which are sequentially formed on the anode layer 32, the white light emitting layer 60 and the cathode layer 52. The first transparent organic layer 72 and the second transparent organic layer 74 are thickness adjustment layers. The thickness of the transparent organic layer is adjusted to enhance the light with a specific wavelength. The first semi-reflective metal layer 76 and the second semi-reflective metal layer 78 are preferably made of the same material as the cathode layer 52.

In order to achieve the optical effect of the microcavity effect, the fabrication of a part of the structure of the resonant cavity structure 70 needs more precise control to produce a layered structure with a desired precise thickness. Therefore, a fine metal mask (hereinafter referred to as FMM) is required as a mask for the vapor deposition process. Because the wavelengths of the three colors of red, green and blue are significantly different, the thicknesses of the transparent organic layers required are also inconsistent, and because the cost of the FMM process is higher than that of the CMM process, in order to optimize the process of the resonant cavity structure 70 and reduce the number of using times of FMM process to reduce the cost of the process, a CMM can be used at the first as a mask for the vapor deposition process to produce a transparent organic layer with the desired smallest thickness corresponding to the color light when manufacturing the resonant cavity structure 70, and then FMM is used as the mask for the vapor deposition process to fabricate the transparent organic layers required for the other two color lights. Therefore, the required number of FMM can be reduced from 6 to 4 during whole processes. In addition, since the transparent organic layer is only a thickness adjustment layer and is not a light-emitting functional layer, there is no interface problem.

The principle of the microcavity effect is to create an optical interference phenomenon inside the cavity structure, so that the photon densities of different energy states are redistributed, only the light with a specific wavelength which conform to the cavity mode is allowed to emit at a specific angle. Therefore, the light of a specific wavelength can be strengthened, and a part of the light is weakened. When the anode and cathode materials are determined, the resonance wavelength is adjusted by adjusting the optical length. The optical length is currently achieved by adjusting the thickness between the two reflecting surfaces. An organic light emitting component with a microcavity effect structure can narrow its electroluminescence spectrum, thereby improving color purity and facilitating display technology applications.

The embodiment of the present disclosure emits the lights having three primary colors of red, green and blue by making white light pass through the resonant cavity structure 70 to generate the microcavity effect. When the anode layer 32 and the cathode layer 52 are energized, the white light emitting layer 60 emits white light of multiple wavelengths, and white light enters the resonant cavity structure 70 of each pixel unit from the cathode layer 52. The lights having three primary colors of red, green and blue are filtered out according to the thicknesses of the transparent organic layers of different pixel units. The electron hole transmission layers of the pixel units of the resonant cavity structure 70 for different primary color lights have different thicknesses to achieve the desired color light emission effect. The thickness of the electron hole transmission layer of red light is about 60 nm (the peak value of the red light spectrum is about 604 nm), the thickness of the hole transmission layer of green light is about 50 nm (the peak of the green light spectrum is about 528 nm), and the thickness of the hole transmission layer of blue light is about 30 nm (the peak of the blue light spectrum is about 468 nm). The number of pixel units of the three primary color lights of red, green, and blue in the embodiments of the present disclosure may be set in such a manner that various colors have the same number and are evenly distributed, or the number of pixel units of a specific color are set different from pixel units of other colors. The size or opening width of the pixel units of the three primary color lights of red, green, and blue in the embodiments of the present disclosure may be made in a manner that each color has the same size or opening width, or the size or opening width of the pixel units may be made in a manner that which of a specific color has different size or different opening width relative to ones of other colors.

Figure 4:
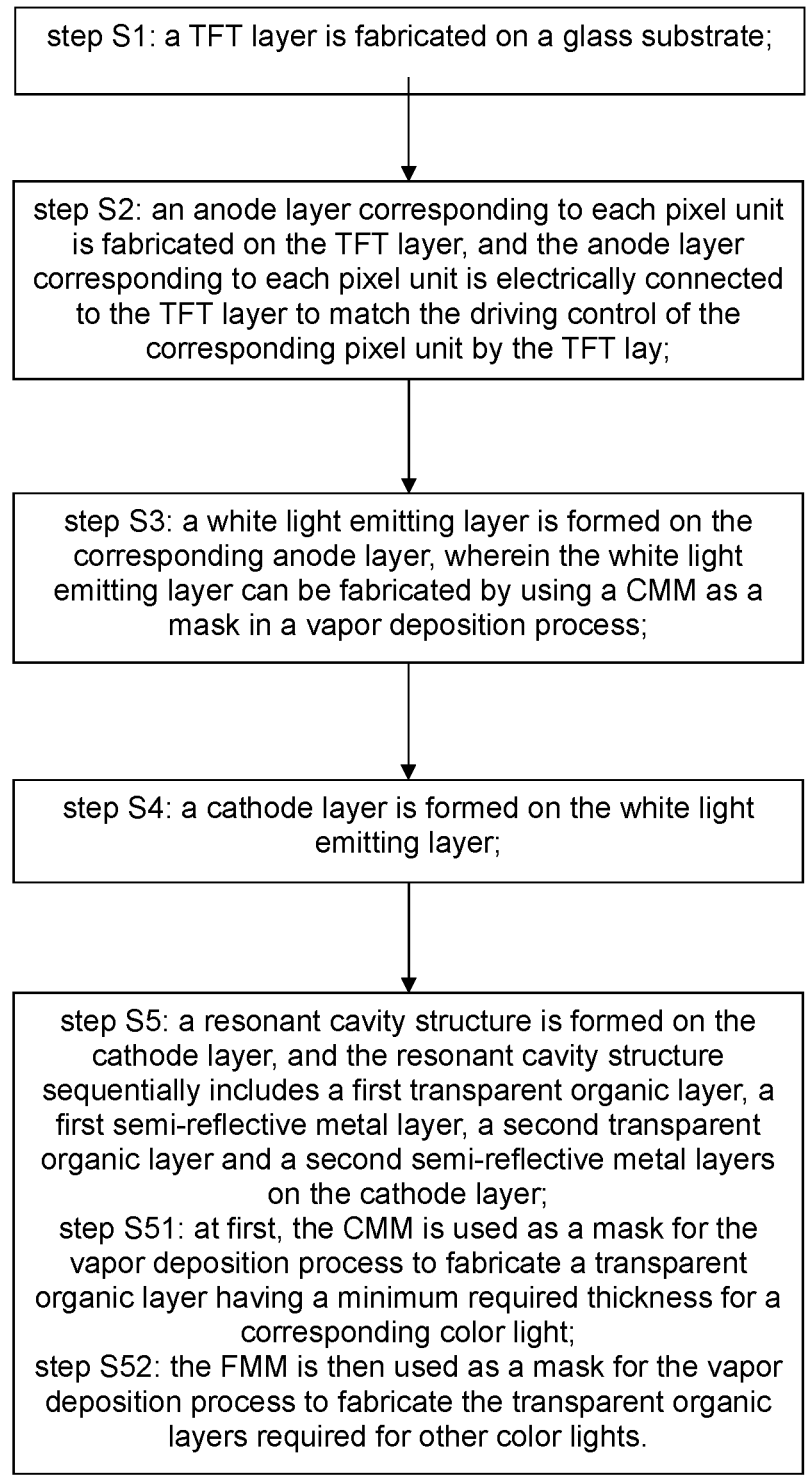
FIG. 4 is a flow chart of a manufacturing method of the full-color display module with microcavity effect.

As shown in FIG. 4, another embodiment of the present disclosure provides a manufacturing method of a full-color display module with microcavity effect. The manufacturing method includes the following steps:

step S1: a TFT layer is fabricated on a glass substrate;

step S2: an anode layer corresponding to each pixel unit is fabricated on the TFT layer, and the anode layer corresponding to each pixel unit is electrically connected to the TFT layer to match the driving control of the corresponding pixel unit by the TFT layer;

step S3: a white light emitting layer is formed on the corresponding anode layer, wherein the white light emitting layer can be fabricated by using a CMM as a mask in a vapor deposition process;

step S4: a cathode layer is formed on the white light emitting layer;

step S5: a resonant cavity structure is formed on the cathode layer, and the resonant cavity structure sequentially includes a first transparent organic layer, a first semi-reflective metal layer, a second transparent organic layer and a second semi-reflective metal layers on the cathode layer.

In step S5, the following steps are further included:

step S51: at first, the CMM is used as a mask for the vapor deposition process to fabricate a transparent organic layer having a minimum required thickness for a corresponding color light;

step S52: the FMM is then used as a mask for the vapor deposition process to fabricate the transparent organic layers required for other color lights.

In the method for manufacturing a full-color display module with microcavity effect provided in the embodiment of the present disclosure, the anode layer is an omni-reflective metal layer, and is preferably made of an ITO layer or a silver material. The cathode layer is a semi-reflective metal layer, and is preferably made of magnesium or silver material.

In the method for manufacturing a full-color display module with microcavity effect provided in the embodiment of the present disclosure, the white light emitting layer can be a stacked structure, for example, a combination of yellow light and blue light, or a stacked structure combining red, green, and blue lights, to achieve the effect for emitting white light.

In the method for manufacturing a full-color display module with microcavity effect provided in the embodiment of the present disclosure, the first semi-reflective metal layer and the second semi-reflective metal layer are preferably made of the same material as the cathode layer.

In the method for manufacturing a full-color display module with microcavity effect provided in the embodiment of the present disclosure, the number of pixel units corresponding to the three primary color lights of red, green, and blue may be set in such a manner that various colors have the same number and are evenly distributed, or the number of pixel units of a specific color are set different from pixel units of other colors.

In the method for manufacturing a full-color display module with microcavity effect provided in the embodiment of the present disclosure, the size or opening width of the pixel units corresponding to the three primary color lights of red, green, and blue may be made in a manner that each color has the same size or opening width, or the size or opening width of the pixel units may be made in a manner that which of a specific color has different size or different opening width relative to ones of other colors.

The full-color display module with a microcavity effect and a manufacturing method thereof provided by the embodiments of the present disclosure, which emits three primary color lights of red, green and blue by making white light to pass through a microcavity structure and occur the microcavity resonance effect, then the lights at specific wavelengths are strengthened, the color purities of lights are improved by narrowing its electroluminescence spectrums. Therefore, the problems such as color mixing errors and pixel defects can be effectively avoided, and the present disclosure is conducive to the application of display technologies.

The specific embodiments described herein are only for explaining the present disclosure, but not to limit the present invention. It should be noted that various changes and modifications can be made to the invention in light of the above detailed description by those skilled in the art, and those various changes and modifications should be considered to be pertained to the scope of the present invention.

What is claimed is:

1. A full-color display module with microcavity effect, said full-color display module comprising: a glass substrate; a thin film transistor (TFT) layer fabricated on the glass substrate; an anode layer corresponding to each pixel unit fabricated on the TFT layer, and the anode layer electrically connected to the TFT layer to match the driving control of each pixel unit by the TFT layer; a white light emitting layer formed on the corresponding anode layer; a cathode layer formed on the white light emitting layer; and a resonant cavity structure formed on the cathode layer; wherein a plurality of electron hole transmission layers of the pixel units of the resonant cavity structure for different primary color lights have different thicknesses to achieve the desired color light emission effect, a thickness of an electron hole transmission layer of red light is about 60 nm, a thickness of an electron hole transmission layer of green light is about 50 nm, and a thickness of an electron hole transmission layer of blue light is about 30 nm.

2. The full-color display module with microcavity effect according to claim 1, wherein the anode layer is an omni-reflective metal layer, and the cathode layer is a semi-reflective metal layer.

3. The full-color display module with microcavity effect according to claim 1, wherein the resonant cavity structure further comprises a first transparent organic layer, a first semi-reflective metal layer, a second transparent organic layer and a second semi-reflective metal layer, which are sequentially formed on the cathode layer.

4. The full-color display module with microcavity effect according to claim 3, wherein the cathode layer is made of material selected from magnesium and silver materials, the first semi-reflective metal layer and the second semi-reflective metal layer are made of same material as the cathode layer.

5. The full-color display module with microcavity effect according to claim 1, wherein the white light emitting layer is a stacked structure combing a plurality of different color light structures.

6. The full-color display module with microcavity effect according to claim 1, wherein the white light emitting layer is fabricated by using a common metal mask (CMM) as a mask for the vapor deposition process.

7. The full-color display module with microcavity effect according to claim 1, wherein the pixel units are set in a manner that the pixel units corresponding to various colors have a same number and are evenly distributed.

8. The full-color display module with microcavity effect according to claim 1, wherein the pixel units are set in a manner that a number of pixel units of a specific color are set different from a number of the pixel units of other colors.

9. The full-color display module with microcavity effect according to claim 1, wherein a size or an opening width of the pixel units of the various colors are made in a manner that the pixel units of each color have the same size or the same opening width.

10. The full-color display module with microcavity effect according to claim 1, wherein a size or an opening width of the pixel units are made in a manner that the pixel unit corresponding to a specific color has the size or the opening width different to the pixel unit corresponding to other colors.

11. A manufacturing method of a full-color display module with microcavity effect, the manufacturing method comprising the steps of: step S1: fabricating a thin film transistor (TFT) layer on a glass substrate; step S2: fabricating an anode layer corresponding to each pixel unit on the TFT layer, wherein the anode layer corresponding to each pixel unit is electrically connected to the TFT layer to match a driving control of each pixel unit by the TFT layer; step S3: forming a white light emitting layer on the corresponding anode layer; step S4: forming a cathode layer on the white light emitting layer; and step S5: forming a resonant cavity structure on the cathode layer, wherein the resonant cavity structure sequentially comprises a first transparent organic layer, a first semi-reflective metal layer, a second transparent organic layer and a second semi-reflective metal layers on the cathode layer; wherein a plurality of electron hole transmission layers of the pixel units of the resonant cavity structure for different primary color lights have different thicknesses to achieve the desired color light emission effect, a thickness of an electron hole transmission layer of red light is about 60 nm, a thickness of an electron hole transmission layer of green light is about 50 nm, and a thickness of an electron hole transmission layer of blue light is about 30 nm.

12. The manufacturing method according to claim 11, wherein the step S3 further comprises a step: the white light emitting layer is fabricated by using a common metal mask (CMM) as a mask in a vapor deposition process.

13. The manufacturing method according to claim 11, wherein the step S5 further comprises steps of: step S51: firstly using a common metal mask (CMM) as a mask for a vapor deposition process to fabricate a transparent organic layer having a minimum required thickness for a corresponding color light; and step S52: using a fine metal mask (FMM) as a mask for a vapor deposition process to fabricate the transparent organic layers required for other color lights.

14. The manufacturing method according to claim 11, wherein the anode layer is an omni-reflective metal layer, and the cathode layer is a semi-reflective metal layer.

15. The manufacturing method according to claim 11, wherein the cathode layer is made of material selected from magnesium and silver materials, the first semi-reflective metal layer and the second semi-reflective metal layer are made of same material as the cathode layer.

16. The manufacturing method according to claim 11, wherein the white light emitting layer is a stacked structure combing different color light structures.

17. The manufacturing method according to claim 11, wherein the pixel units are set in a manner that the pixel units corresponding to various colors have a same number and are evenly distributed.

18. The manufacturing method according to claim 11, wherein the pixel units are set in a manner that a number of pixel units of a specific color are set different from a number of the pixel units of other colors.

19. The manufacturing method according to claim 11, wherein a size or an opening width of the pixel units of various colors are made in a manner that the pixel units of each color have the same size or the same opening width.

20. The manufacturing method according to claim 11, wherein a size or an opening width of the pixel units are made in a manner that the pixel unit corresponding to a specific color has the size or the opening width different to the pixel units corresponding to other colors.

\* \* \* \* \*